United States Patent
Fujita et al.

(10) Patent No.: US 7,826,268 B2
(45) Date of Patent: Nov. 2, 2010

(54) NONVOLATILE SEMICONDUCTOR MEMORY

(75) Inventors: Norihiro Fujita, Yokohama (JP);
Toshihiko Himeno, Yokohama (JP);
Hitoshi Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 12/236,015

(22) Filed: Sep. 23, 2008

(65) Prior Publication Data

US 2009/0080261 A1 Mar. 26, 2009

(30) Foreign Application Priority Data

Sep. 25, 2007 (JP) ............................ 2007-246816

(51) Int. Cl.
*G11C 11/34* (2006.01)
*G11C 16/04* (2006.01)
(52) U.S. Cl. .......................... 365/185.17; 365/185.18
(58) Field of Classification Search ............ 365/185.17, 365/185.18, 185.01
See application file for complete search history.

(56) References Cited

U.S. PATENT DOCUMENTS

| 5,606,527 | A | 2/1997 | Kwack et al. |
| 6,064,608 | A * | 5/2000 | Ikeda ......................... 365/200 |
| 6,307,778 | B1 | 10/2001 | Micheloni et al. |
| 6,781,897 | B2 * | 8/2004 | Dvir et al. ................... 365/200 |
| 6,781,902 | B2 | 8/2004 | Oumiya et al. |
| 7,295,472 | B2 * | 11/2007 | Pascucci et al. ........ 365/185.17 |

FOREIGN PATENT DOCUMENTS

| JP | 11-507166 | 6/1999 |
| JP | 2001-135100 | 5/2001 |
| JP | 2002-74995 | 3/2002 |

* cited by examiner

*Primary Examiner*—Anh Phung
(74) *Attorney, Agent, or Firm*—Oblon, Spivak, McClelland, Maier & Neustadt, L.L.P.

(57) ABSTRACT

A nonvolatile semiconductor memory, has a first wire; a second wire adjacent to the first wire; a third wire disposed next to the second wire such that the second wire is disposed between the first wire and the third wire; a power supply circuit for setting each of the wires at a predetermined potential; and a determining circuit for determining presence or absence of a short circuit between the wires.

13 Claims, 5 Drawing Sheets

NONVOLATILE SEMICONDUCTOR MEMORY

CROSS-REFERENCE TO RELATED APPLICATION

This application is based upon and claims the benefit of priority from the prior Japanese Patent Application No. 2007-246816, filed on Sep. 25, 2007, the entire contents of which are incorporated herein by reference.

BACKGROUND OF THE INVENTION

1. Field of the Invention

The present invention relates to a nonvolatile semiconductor memory including a plurality of wires.

2. Background Art

In recent years, nonvolatile semiconductor memories such as a NAND flash memory have been produced with smaller design rules, and smaller design rules has been studied through various processes. Accordingly, the latest process technology may suffer from defective phenomena different from defective phenomena that may occur in a process technology of the prior art.

One of the defective phenomena is, for example, a short circuit between wires.

Among short circuits between wires, only a short circuit between adjacent wires has been a problem in the prior art.

Thus in a nonvolatile semiconductor memory of the prior art, a check is made only for short circuits between adjacent wires in, for example, a product test (for example, see Japanese Patent Laid-Open No. 2001-135100).

However, processes with smaller design rules may cause short circuits not only between adjacent wires but also between wires not adjacent to each other.

As described above, a check is made only for short circuits between adjacent wires in the nonvolatile semiconductor memory of the prior art. Thus it has not been possible to detect short circuits between wires not directly adjacent to each other.

SUMMARY OF THE INVENTION

According to one aspect of the present invention, there is provided: a nonvolatile semiconductor memory, comprising:

a first wire;

a second wire adjacent to the first wire;

a third wire disposed next to the second wire such that the second wire is disposed between the first wire and the third wire;

a power supply circuit for setting each of the wires at a predetermined potential; and a determining circuit for determining presence or absence of a short circuit between the wires, wherein the power supply circuit fixes the second wire at a second potential different from a first potential, fixes the third wire at a third potential different from the first potential, and then fixes the first wire at the first potential, and after the first wire is brought into a floating state and a predetermined period has elapsed, the determining circuit determines whether or not the first wire is short-circuited with at least one of the second wire and the third wire, based on a potential of the first wire in the floating state.

DETAILED DESCRIPTION

An embodiment to which the present invention is applied will be described below in accordance with the accompanying drawings.

The following embodiment will describe, as an example, the case where the present invention is applied to a NAND flash memory. The following will particularly discuss the case where the bit lines of the NAND flash memory are checked for short circuits.

First Embodiment

Figure 1:
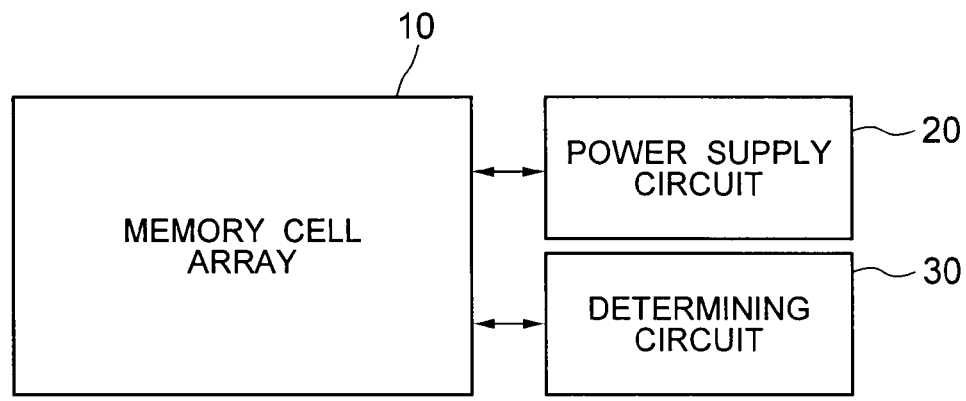
FIG. 1 is a block diagram showing an example of the main configuration of a nonvolatile semiconductor memory according to a first embodiment which is an aspect of the present invention.

FIG. 1 is a block diagram showing an example of the main configuration of a nonvolatile semiconductor memory according to a first embodiment which is an aspect of the present invention. In FIG. 1, a configuration such as a row decoder and a column decoder of a NAND flash memory is omitted.

Figure 2:
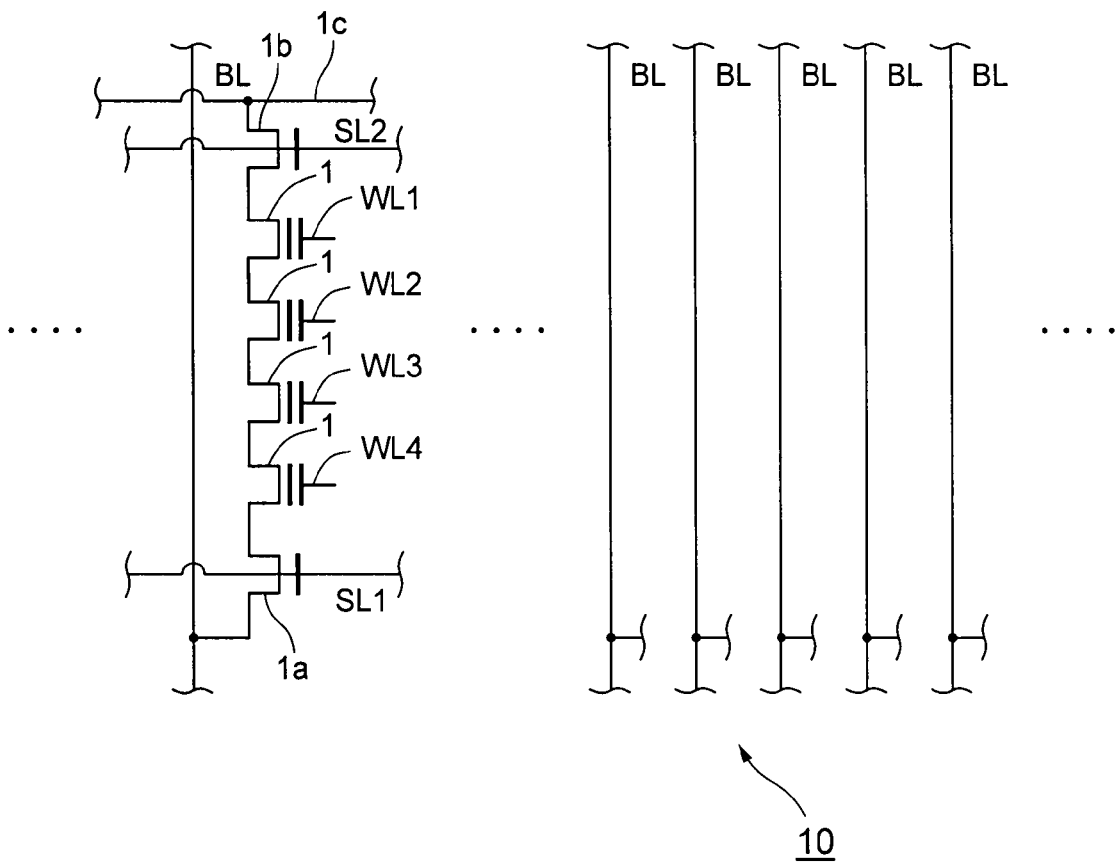
FIG. 2 is a circuit diagram showing an example of the cell configuration of a memory cell array shown in FIG. 1.
Figure 3:
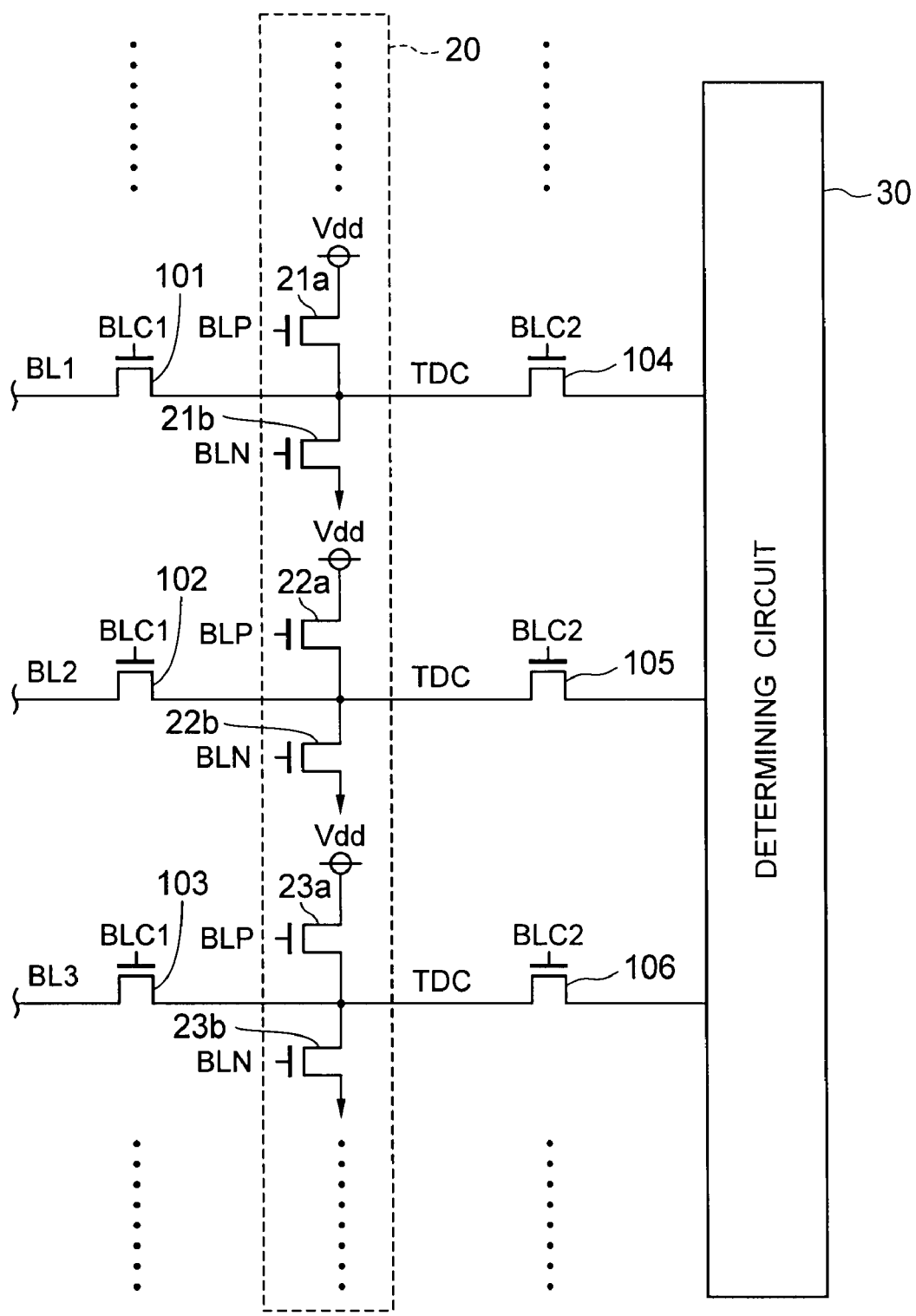
FIG. 3 is a circuit diagram showing an example of the connection relationship among the bit lines of the memory cell array, a power supply circuit, and a determining circuit which are shown in FIG. 1.

FIG. 2 is a circuit diagram showing an example of the cell configuration of a memory cell array shown in FIG. 1. FIG. 3 is a circuit diagram showing an example of the connection relationship among the bit lines of the memory cell array, a power supply circuit, and a determining circuit which are shown in FIG. 1.

As shown in FIG. 1, a nonvolatile semiconductor memory 100 includes a memory cell array 10 having memory cells arranged in a matrix form to store data, a power supply circuit 20 for supplying voltage to the memory cell array 10, and a determining circuit 30.

Further, as shown in FIG. 2, a plurality of memory cells 1 are connected in series, each of which is made up of a MOS transistor having a floating gate. One end of the plurality of memory cells 1 connected in series is connected to a bit line BL via a first selecting transistor 1a. The other end of the plurality of memory cells 1 connected in series is connected to a common source line 1c via a second selecting transistor 1b.

The gates of the memory cells 1 are connected to word lines WL1 to WL4, respectively. The gate of the first selecting transistor 1a is connected to a selecting line SL1 and the gate of the second selecting transistor 1b is connected to a selecting line SL2.

As shown in FIG. 2, the plurality of bit lines BL to which the memory cells 1 are connected are arranged in parallel.

Further, as shown in FIG. 3, the power supply circuit 20 includes, for example, first MOS transistors 21a, 22a and 23a and second MOS transistors 21b, 22b and 23b which are connected in series between a power supply Vdd and the ground.

Moreover, a joint of the first MOS transistor 21a and the second MOS transistor 21b is connected to a bit line BL1 via a first switch element 101 acting as a MOS transistor.

A joint of the first MOS transistor 22a and the second MOS transistor 22b is similarly connected to a bit line BL2 via a first switch element 102 acting as a MOS transistor.

A joint of the first MOS transistor 23a and the second MOS transistor 23b is similarly connected to a bit line BL3 via a first switch element 103 acting as a MOS transistor.

The bit line BL1 is connected to the determining circuit 30 via the first switch element 101 and a second switch element 104 acting as a MOS transistor.

The bit line BL2 is similarly connected to the determining circuit 30 via the first switch element 102 and a second switch element 105 acting as a MOS transistor.

The bit line BL3 is similarly connected to the determining circuit 30 via the first switch element 103 and a second switch element 106 acting as a MOS transistor.

As described above, the circuit stages of the first and second MOS transistors are connected to the respective bit lines. By switching on/off the first and second MOS transistors, the bit lines can be fixed at a power supply potential Vdd or a ground potential. In other words, the power supply circuit 20 sets each of the bit lines (wires) at a predetermined potential.

Further, by turning off the first switch elements, the bit lines can be brought into a floating state. In the floating state, the bit lines are disconnected from the other circuits. Thus, for example, the bit lines in the floating state can be ideally kept at a potential when not short-circuited with the other bit lines and so on.

The potentials of the bit lines are transmitted to the determining circuit 30. The determining circuit 30 determines the presence or absence of short circuits between the bit lines (wires) based on the transmitted potentials.

The following will discuss operations for making a check for short circuits between the bit lines (wires) in the nonvolatile semiconductor memory configured thus.

The present embodiment will describe the case where a check is made for short circuits between a target bit line (wire) and two bit lines (wires) adjacent to the target bit line. The same operations are performed when a check is made for short circuits between a target bit line (wire) and three or more bit lines (wires) adjacent to the target bit line.

Figure 4:
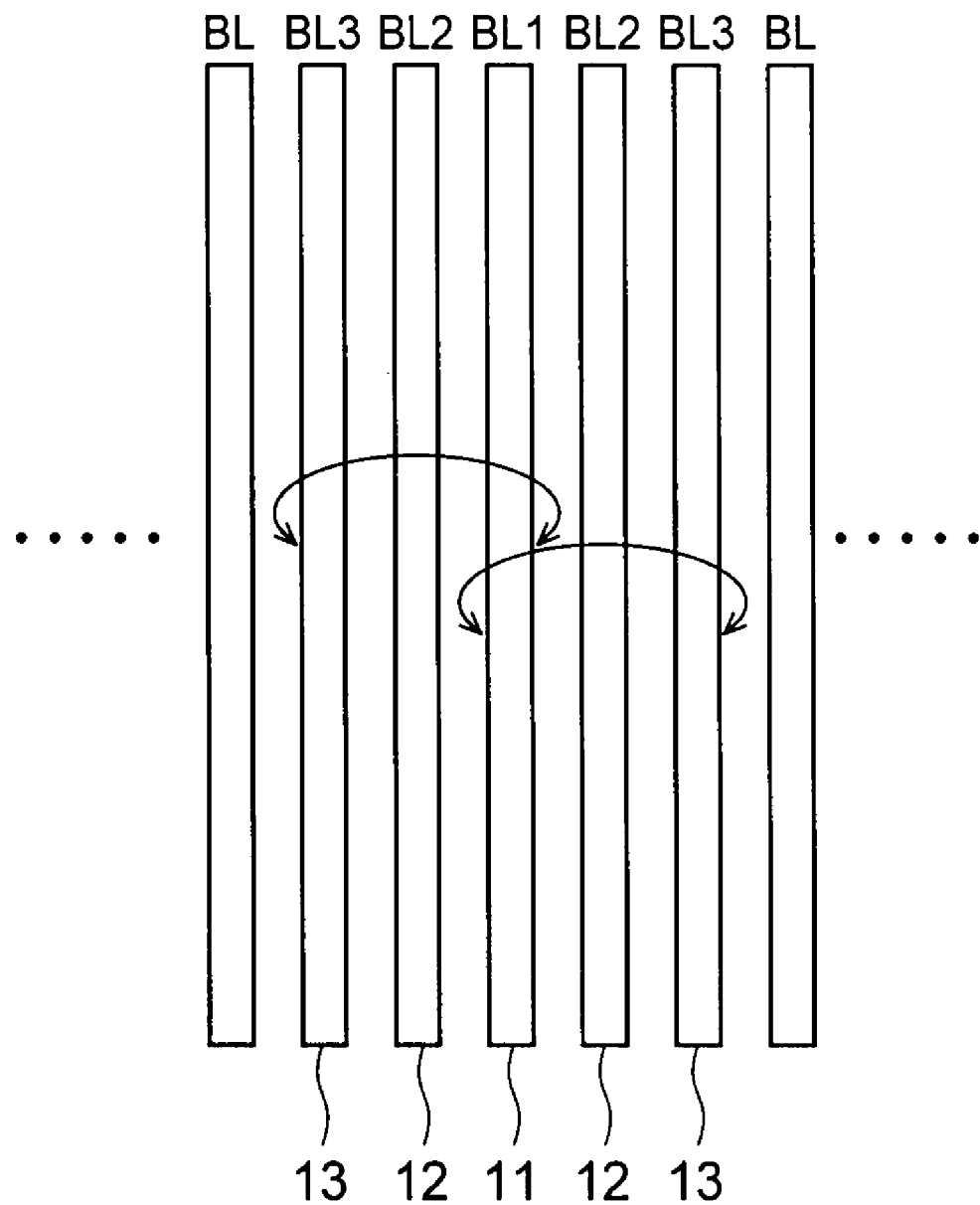
FIG. 4 illustrates the layout of the bit lines of the memory cell array shown in FIG. 1.

FIG. 4 illustrates the layout of the bit lines of the memory cell array shown in FIG. 1.

In FIG. 4, a first bit line 11 is a target first wire. A second bit line 12 is a second wire adjacent to the first bit line 11. A third bit line 13 is a third wire which is disposed next to the second bit line 12 such that the second bit line 12 is disposed between the first bit line 11 and the third bit line 13.

The following will describe a principle (concept) for detecting short circuits between adjacent bit lines (wires) according to the present invention.

First, the target first bit line is set at a certain potential and the adjacent second and third bit lines are fixed at a different potential from the potential of the first bit line.

When the potential of the first bit line changes by a predetermined value or larger regardless of whether the target first bit line is in the floating state or not, it is considered that the charge of the first bit line has passed through the second and third bit lines. In other words, it is considered that the first bit line is short-circuited with the other bit lines.

When the potential of the first bit line changes by a predetermined value or smaller, it is considered that the bit line is insulated from the other adjacent bit lines.

According to the principle, it is possible to identify short circuits between adjacent bit lines (wires) or between bit lines (wires) not adjacent to each other. In other words, it is possible to make a check for a short circuit between the first bit line and the third bit line which are not directly adjacent to each other.

Figure 5:
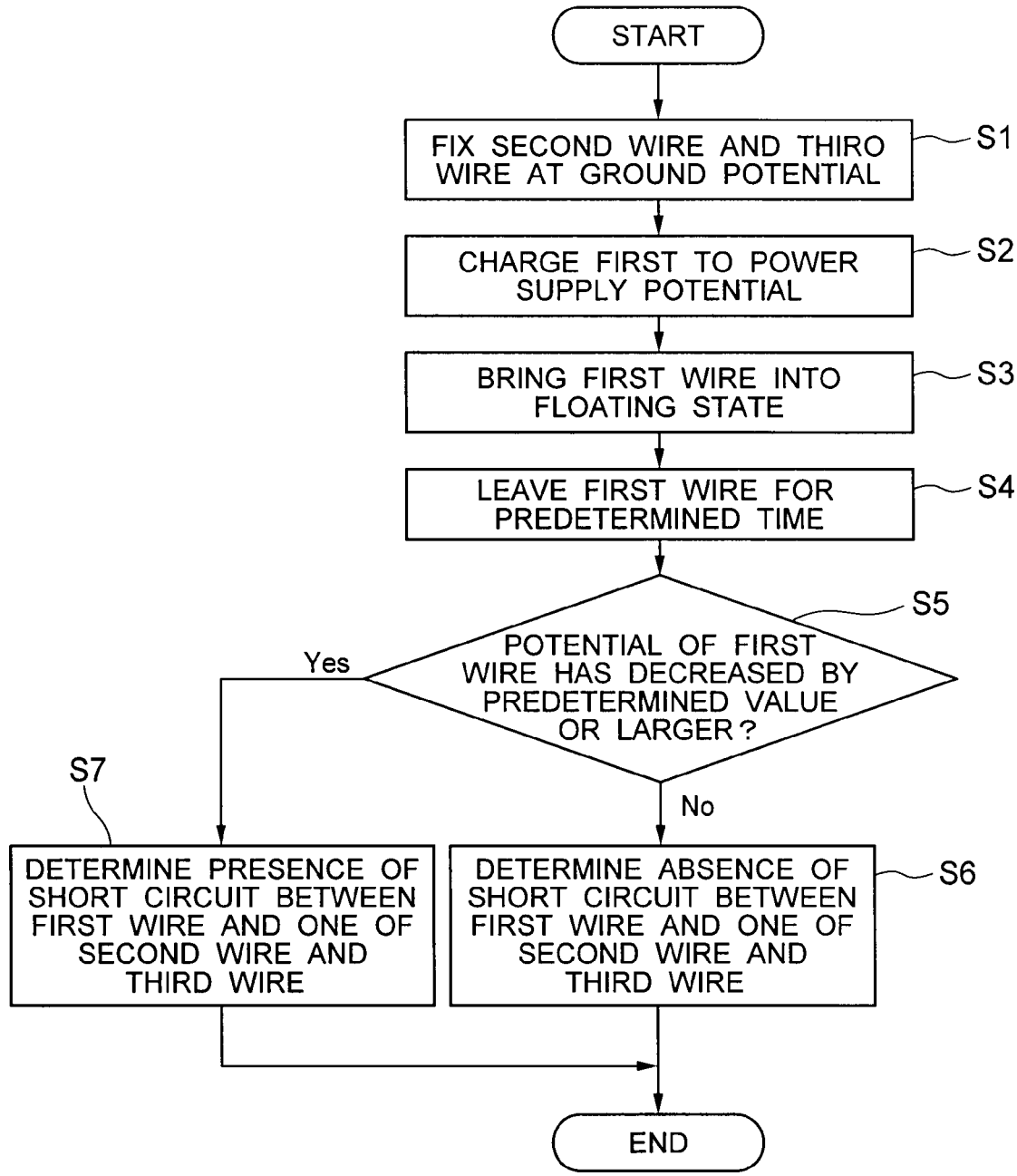
FIG. 5 is a flowchart showing the operations for making a check for short circuits between the bit lines (wires) in the nonvolatile semiconductor memory.

FIG. 5 is a flowchart showing the operations for making a check for short circuits between the bit lines (wires) in the nonvolatile semiconductor memory.

As shown in FIG. 5, first, the power supply circuit 20 of the nonvolatile semiconductor memory 100 fixes the second bit line 12 at a second potential (in this case, the ground potential) different from a first potential (in this case, the power supply potential) and fixes the third bit line 13 at a third potential (in this case, the ground potential) different from the first potential (step S1).

After that, the power supply circuit 20 charges the first bit line 11 to the power supply potential which is the first potential (step S2).

Next, the nonvolatile semiconductor memory 100 brings the first bit line 11 into the floating state (step S3).

Then, the nonvolatile semiconductor memory 100 leaves the first bit line 11 for a predetermined period after bringing the first bit line 11 into the floating state (step S4).

Next, the determining circuit 30 of the nonvolatile semiconductor memory 100 determines whether or not the potential of the first bit line 11 has decreased by the predetermined value or larger (in other words, whether or not the potential of the first bit line 11 is different from the power supply potential by the predetermined value or larger) (step S5).

When the potential of the first bit line 11 has not decreased by the predetermined value or larger (in other words, the potential of the first bit line 11 is not different from the power supply potential by the predetermined value or larger), the determining circuit 30 determines that the first bit line 11 is not short-circuited with the second and third bit lines 12 and 13 (step S6).

When the potential of the first bit line 11 has decreased by the predetermined value or larger (in other words, the potential of the first bit line 11 is different from the power supply potential by the predetermined value or larger), the determining circuit 30 determines that the first bit line 11 is short-circuited with at least one of the second bit line 12 and the third bit line 13 (step S7).

In other words, in steps S5 to S7, the determining circuit 30 determines whether or not the first bit line 11 is short-circuited with at least one of the second bit line 12 and the third bit line 13, based on the potential of the first bit line 11 in the floating state.

After step S7, for example, the second bit line 12 adjacent to the first bit line 11 is defined as another target first bit line and the same flow is performed again.

According to the above flow, the nonvolatile semiconductor memory 100 makes a check for short circuits between the bit lines (wires). This flow is performed on all target bit lines.

In the above flow, the first potential is a power supply potential and the second potential and third potential are ground potentials. Other combinations of potentials may be used as long as the first potential and the second and third potentials are different from each other.

For example, the first potential may be a ground potential and the second and third potentials may be power supply potentials.

Alternatively, the third potential may be a ground potential and the second potential may be a power supply potential. In this case, the first potential is a potential other than the ground potential and the power supply potential.

The power supply circuit may discharge the first bit line as necessary in order to set the first bit line at the first potential.

As an example of the operation of the nonvolatile semiconductor memory for performing the above flow, the operation of the circuit shown in FIG. 3 will be described below. For simplicity, the following will only discuss the wire which is adjacent to the target first bit line BL1 of FIG. 3 along one side. The same holds true on the opposite side.

Figure 6:
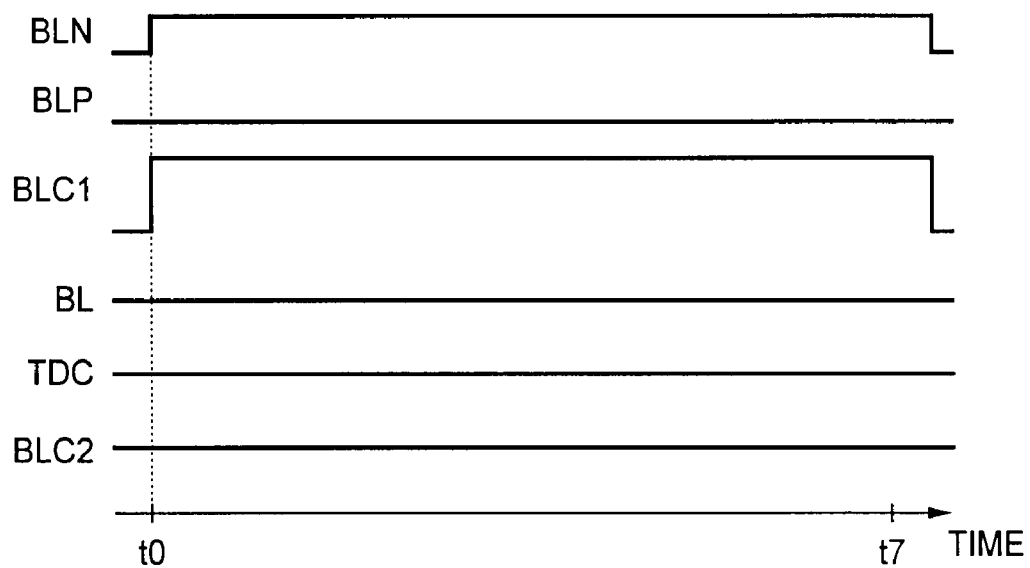
FIG. 6 is a timing chart showing the operation of the nonvolatile semiconductor memory for fixing the potentials of the second and third bit lines which are checked for short circuits with the first bit line.

FIG. 6 is a timing chart showing the operation of the nonvolatile semiconductor memory for fixing the potentials of the second and third bit lines which are checked for short circuits with the first bit line. Signals shown in FIG. 6 are applied to the circuits connected to the second and third bit lines BL2 and BL3 of FIG. 3.

Figure 7:
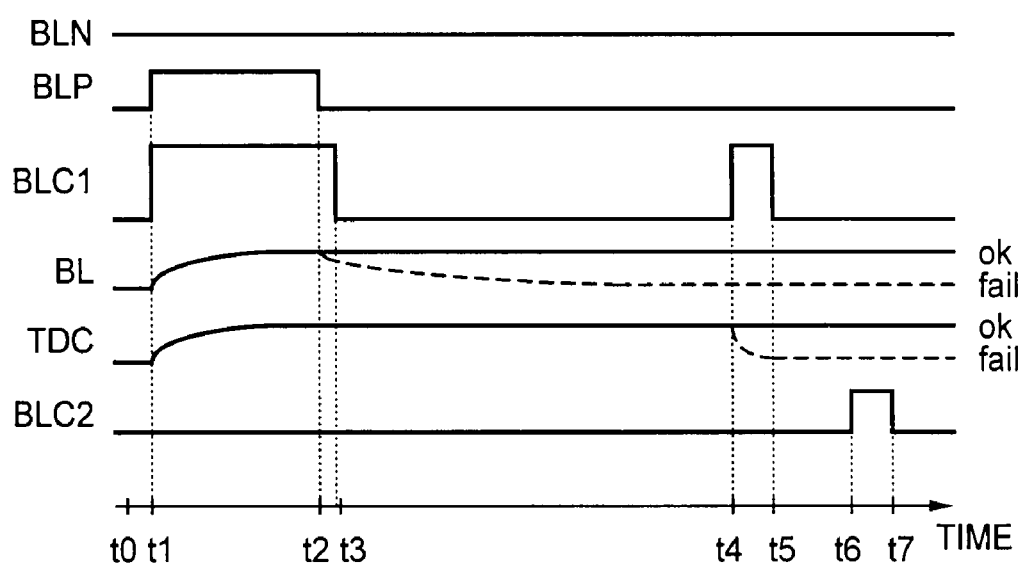
FIG. 7 is a timing chart showing the operation of the nonvolatile semiconductor memory for transmitting information about the potential of the target first bit line to the determining circuit.

FIG. 7 is a timing chart showing the operation of the nonvolatile semiconductor memory for transmitting information about the potential of the target first bit line to the determining circuit. Signals shown in FIG. 7 are applied to the circuits connected to the first bit line BL1 of FIG. 3.

First, as shown in FIG. 6, BLN and BLC1 are set at "High" at time t0. This state continues until time t7. Thus the second MOS transistors 22b and 23b and the first switch elements 102 and 103 in FIG. 3 are turned on and the second and third bit lines are fixed at the ground potential (corresponding to step S1 of FIG. 5).

Next, as shown in FIG. 7, BLP and BLC1 are set at "High" at time t1. Thus the first MOS transistor 21a and the first switch element 101 in FIG. 3 are turned on and the first bit line BL1 is charged to the power supply potential Vdd (corresponding to step S2 of FIG. 5). At this moment, a wire TDC between the first switch element 101 and the second switch element 104 is also charged to the power supply potential Vdd.

Next, as shown in FIG. 7, BLP is set at "Low" at time t2. Thus the first MOS transistor 21a is turned off and charging for the first bit line is completed.

Then, as shown in FIG. 7, BLC1 is set at "Low" at time t3. Thus the first switch element 101 of FIG. 3 is turned off and the first bit line is brought into the floating state (corresponding to step S3 of FIG. 5).

Next, as shown in FIG. 7, the first bit line is left for a predetermined time between time t3 and time t4 (corresponding to step S4 of FIG. 5).

Then, as shown in FIG. 7, BLC1 is set at "High" at time t4. Thus the first switch element 101 of FIG. 3 is turned on and the potential of the first bit line BL1 is transmitted to the wire TDC.

In other words, when the first bit line BL1 is not short-circuited with the second and third bit lines BL2 and BL3, the potential of the first bit line BL1 is ideally kept, so that the potential of the wire TDC does not change.

When the first bit line BL1 is short-circuited with the second and third bit lines BL2 and BL3, the potential of the first bit line BL1 decreases, so that the potential of the wire TDC decreases.

Next, as shown in FIG. 7, BLC1 is set at "Low" at time t5. Thus the first switch element 101 of FIG. 3 is turned off and the transmission of the potential to the wire TDC is completed.

Then, as shown in FIG. 7, BLC2 is set at "High" from time t6 to time t7. Thus the second switch element 104 of FIG. 3 is turned on and the potential of the wire TDC is transmitted to the determining circuit 30. In other words, the potential (information) corresponding to the potential of the first bit line BL1 is transmitted to the determining circuit 30.

Next, as in step S5, the determining circuit 30 determines whether or not the potential of the first bit line BL1 is different from the power supply potential by the predetermined value or larger, based on the transmitted potential (that is, the potential of the first bit line BL1).

Further, as in step S6, when the potential of the first bit line BL1 is not different from the power supply potential by the predetermined value or larger, the determining circuit 30 determines that the first bit line BL1 is not short-circuited with the second and third bit lines BL2 and BL3.

As in step S7, when the potential of the first bit line BL1 is different from the power supply potential by the predetermined value or larger, the determining circuit 30 determines that the first bit line BL1 is short-circuited with at least one of the second bit line BL2 and the third bit line BL3.

As described above, according to the nonvolatile semiconductor memory of the present embodiment, it is possible to make a check for short circuits between wires not adjacent to each other.

It is thus possible to mount a circuit system for making a check for short circuits not only between adjacent wires but also between wires not adjacent to each other when a wiring layer is checked for short circuits, and conduct tests, thereby improving the product yield of the nonvolatile semiconductor memory.

In the present embodiment, the wires to be checked are bit lines. The present invention is similarly applicable to word lines and other kinds of wires.

What is claimed is:

1. A nonvolatile semiconductor memory, comprising:
   a first wire;
   a second wire adjacent to the first wire;
   a third wire disposed next to the second wire such that the second wire is disposed between the first wire and the third wire;
   a power supply circuit for setting each of the wires at a predetermined potential; and
   a determining circuit for determining presence or absence of a short circuit between the wires,
   wherein the power supply circuit fixes the second wire at a second potential different from a first potential, fixes the third wire at a third potential different from the first potential, and then fixes the first wire at the first potential, and
   after the first wire is brought into a floating state and a predetermined period has elapsed,
   the determining circuit determines whether or not the first wire is short-circuited with at least one of the second wire and the third wire, based on a potential of the first wire in the floating state.

2. The nonvolatile semiconductor memory according to claim 1, wherein when the potential of the first wire is different from the first potential by a predetermined value or larger, the determining circuit determines that the first wire is short-circuited with at least one of the second wire and the third wire.

3. The nonvolatile semiconductor memory according to claim 1, wherein the first to third wires are bit lines connected to memory cells.

4. The nonvolatile semiconductor memory according to claim 2, wherein the first to third wires are bit lines connected to memory cells.

5. The nonvolatile semiconductor memory according to claim 1, wherein the first potential is a power supply potential and the second potential and the third potential are ground potentials.

6. The nonvolatile semiconductor memory according to claim 2, wherein the first potential is a power supply potential and the second potential and the third potential are ground potentials.

7. The nonvolatile semiconductor memory according to claim 3, wherein the first potential is a power supply potential and the second potential and the third potential are ground potentials.

8. The nonvolatile semiconductor memory according to claim 4, wherein the first potential is a power supply potential and the second potential and the third potential are ground potentials.

9. The nonvolatile semiconductor memory according to claim 1, wherein the nonvolatile semiconductor memory is a NAND flash memory.

10. The nonvolatile semiconductor memory according to claim 2, wherein the nonvolatile semiconductor memory is a NAND flash memory.

11. The nonvolatile semiconductor memory according to claim 3, wherein the nonvolatile semiconductor memory is a NAND flash memory.

12. The nonvolatile semiconductor memory according to claim 4, wherein the nonvolatile semiconductor memory is a NAND flash memory.

13. The nonvolatile semiconductor memory according to claim 5, wherein the nonvolatile semiconductor memory is a NAND flash memory.

* * * * *